United States Patent
Kawasaki

(10) Patent No.: US 9,919,402 B2
(45) Date of Patent: Mar. 20, 2018

(54) METHOD OF POLISHING WAFER AND WAFER POLISHING APPARATUS

(71) Applicant: SUMCO CORPORATION, Tokyo (JP)

(72) Inventor: Tomonori Kawasaki, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 191 days.

(21) Appl. No.: 14/914,747

(22) PCT Filed: Jun. 24, 2014

(86) PCT No.: PCT/JP2014/003393
§ 371 (c)(1),
(2) Date: Feb. 26, 2016

(87) PCT Pub. No.: WO2015/029294
PCT Pub. Date: Mar. 5, 2015

(65) Prior Publication Data
US 2016/0207161 A1    Jul. 21, 2016

(30) Foreign Application Priority Data

Aug. 28, 2013  (JP) .................................. 2013-176931

(51) Int. Cl.
B24B 37/005 (2012.01)
B24B 37/20 (2012.01)
(Continued)

(52) U.S. Cl.
CPC ............ *B24B 37/005* (2013.01); *B24B 37/20* (2013.01); *B24B 37/34* (2013.01); *B24B 49/06* (2013.01); *H01L 21/02024* (2013.01)

(58) Field of Classification Search
CPC ....... B24B 37/005; B24B 37/20; B24B 37/34; B24B 49/06; H01L 21/02024
See application file for complete search history.

(56) References Cited

U.S. PATENT DOCUMENTS 5,433,650 A * 7/1995 Winebarger .......... B24B 37/013
                                                        257/E21.244
5,851,138 A   12/1998 Hempel, Jr.
(Continued)

FOREIGN PATENT DOCUMENTS

JP    2003-515246    4/2003
JP    2004-335713    11/2004
(Continued)

OTHER PUBLICATIONS

Office Action issued in Korea Counterpart Patent Appl. No. 10-2016-7005150, dated Sep. 8, 2016, along with an English translation thereof.

(Continued)

Primary Examiner — Marc Carlson
(74) Attorney, Agent, or Firm — Greenblum & Bernstein, P.L.C.

(57) ABSTRACT

A practical method of polishing a wafer that can reduce wafer loss due to dummy polishing, and stabilize the LPD count in production wafers at a low level, is provided. In the method of polishing a wafer according to the present disclosure, a wafer 104 is brought into contact with a polishing cloth 112 provided on the surface of a polishing plate 110, and the wafer 104 and the polishing plate 110 are rotated, thereby performing several rounds of a polishing process on the surface of the wafer 104 using the same polishing cloth 112. At this time, the contact angle of the polishing cloth is measured, and based on the measured value thereof, the timing for a switchover from an initial polishing (or a dummy polishing) mode to a production polishing mode is determined.

8 Claims, 6 Drawing Sheets

(51) Int. Cl.
B24B 37/34 (2012.01)
B24B 49/06 (2006.01)
H01L 21/02 (2006.01)

(56) References Cited

U.S. PATENT DOCUMENTS

| | | | | |
|---|---|---|---|---|
| 5,990,012 | A * | 11/1999 | Robinson | B24B 41/047 |
| | | | | 438/692 |
| 6,361,409 | B1 * | 3/2002 | Vishwanathan | B24B 53/017 |
| | | | | 451/56 |
| 9,266,213 | B2 * | 2/2016 | Kawasaki | B24B 7/228 |
| 9,630,292 | B2 * | 4/2017 | Kawasaki | B24B 37/005 |
| 2005/0064709 | A1 * | 3/2005 | Shimomura | B24B 37/24 |
| | | | | 438/689 |
| 2009/0061743 | A1 * | 3/2009 | Jew | B24B 37/042 |
| | | | | 451/287 |
| 2010/0273399 | A1 * | 10/2010 | Li | C07D 235/06 |
| | | | | 451/41 |
| 2017/0203408 | A1 * | 7/2017 | Ganapathiappan | B24B 37/24 |

FOREIGN PATENT DOCUMENTS

| | | |
|---|---|---|
| JP | 2004335713 A * | 11/2004 |
| JP | 2005-209863 | 8/2005 |
| JP | 2005-342881 | 12/2005 |
| JP | 2006-147980 A | 6/2006 |
| JP | 2009-113196 | 5/2009 |

OTHER PUBLICATIONS

Search Report issued by in PCT/JP2014/003393 Patent Application No. , dated Sep. 9, 2014.

Taiwan Official Action received in Appl. No. 10421309760, dated Sep. 25, 2015.

Office Action issued in Chinese family member Patent Appl. No. 201480047490.9, dated Nov. 6, 2017 , along with an English translation thereof.

* cited by examiner

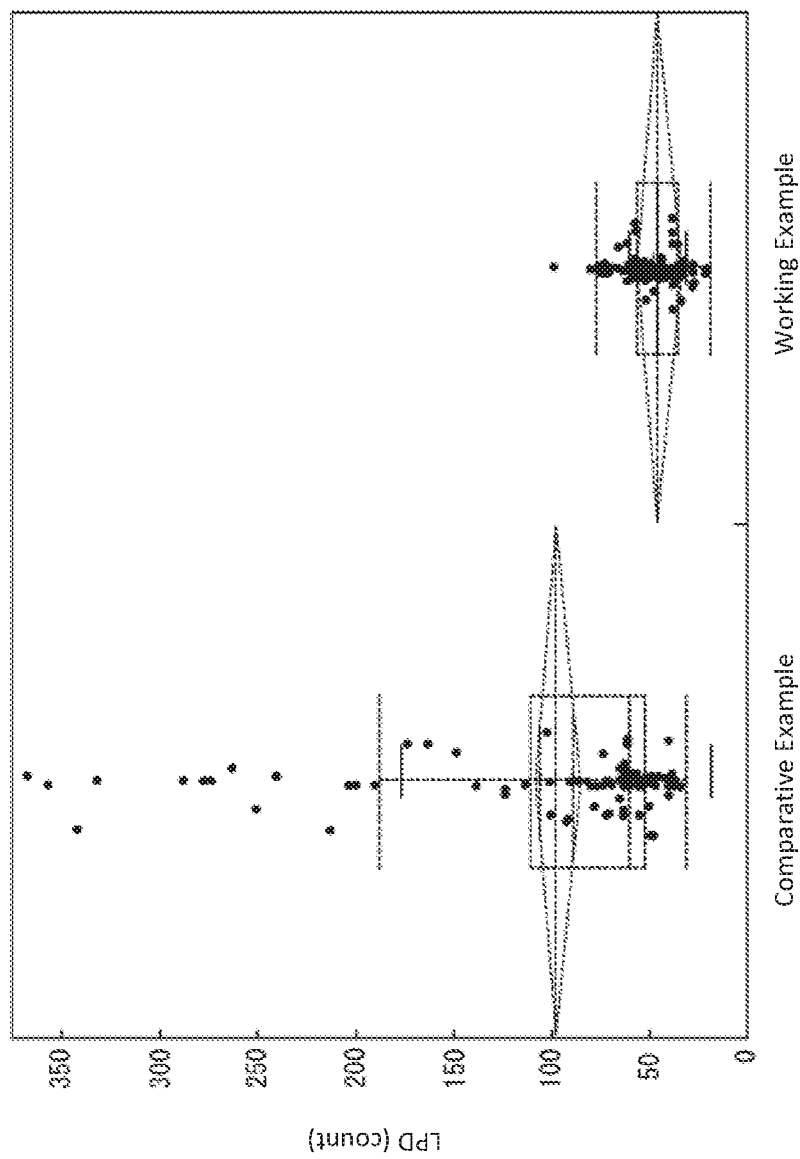

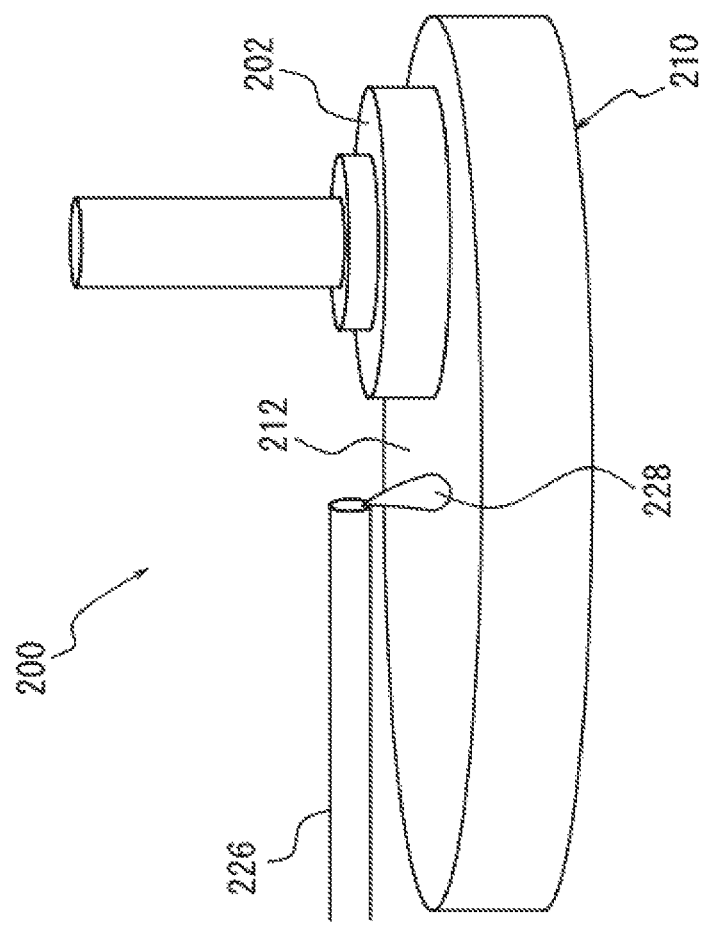

US 9,919,402 B2

METHOD OF POLISHING WAFER AND WAFER POLISHING APPARATUS

TECHNICAL FIELD

The present disclosure relates to a method of polishing a wafer and a wafer polishing apparatus.

BACKGROUND ART

A process for producing semiconductor wafers consists primarily of a step of pulling us a single-crystal for producing single-crystal ingots and a step of processing the single-crystal ingots thus produced. This processing step typically includes a slicing step, a lapping step, a chamfering step, an etching step, a mirror polishing step, a cleaning step and the like, and semiconductor wafers with mirror polished surfaces are produced through these steps.

In the mirror polishing step, several stages of polishing steps including rough polishing, finish polishing and the like are performed. In the finish-polishing step, for example, one side of the wafer is subjected to chemical mechanical polishing (CMP) with a single-side polishing apparatus 200 as shown in FIG. 6. CMP is a technique in which a polishing solution having an etching effect on the wafer, the work being polished, is used to etch the wafer while mechanically polishing the wafer with abrasive grains contained in the polishing solution. The single-side polishing apparatus 200 includes a head 202 for retaining a wafer and a polishing plate 210 having a polishing cloth 212 provided on its surface. The head 202 presses a polishing target surface of the wafer against the polishing cloth 212. Then, the wafer surface is polished by rotating the head 202 together with the polishing plate 210 while a polishing solution 228 is supplied from a polishing solution supply unit 226 to upon the polishing cloth 212.

Typically, various impurities become adhered to an unused polishing cloth in the process of production of the polishing cloth. These impurities cause damage to the wafer surface. For this reason, large numbers of light point defects (LPDs) are detected in a post-polishing inspection step performed on the surface of a wafer polished with a polishing cloth immediately after the start of use of the cloth. To solve this problem, as described in JP 2005-209863 A (PTL 1), in the case of using a new polishing cloth, it is used to polish a stipulated number of wafers not to be shipped as products and then the polishing of wafers to be shipped as products is performed. Note that in this Specification, the initial polishing step which is performed immediately after the start of use of a new polishing cloth and which provides a polished water that is not used as a product is called "dummy polishing mode," while the polishing step which is performed thereafter and which provides a polished wafer that is used as a product is called "production polishing mode."

Up until now, once a stipulated number of rounds of dummy polishing have been done, or in other words, once the cumulative number of wafers polished with a new polishing cloth has reached the stipulated number of wafers, a shift to production polishing mode is done, and it is typical for the "stipulated number of rounds" and "stipulated number of wafers" to be uniformly set to fixed values as long as the same kind of polishing cloth is used.

CITATION LIST

Patent Literature

PTL 1: JP 2005-209863 A

SUMMARY

However, according to studies conducted by the present inventor, it was found that even with the same kind of polishing cloth (polishing cloth made from the same material, polishing cloth from the same product, etc.), the number of rounds of polishing performed in dummy polishing mode (cumulative number of wafers polished) required until the LPD count in polished wafers stabilizes at a low level is different for each individual polishing cloth. For this reason, with the conventional method in which the number of rounds of polishing performed in dummy polishing mode is uniformly set to a fixed number of rounds when using individual polishing cloths even though they are the same kind of polishing cloth, one of the following problems occurs. In the case of using a polishing cloth A in which the aforementioned number of rounds of dummy polishing required is greater than the set number of rounds of polishing performed in dummy polishing mode, wafers with large numbers of LPDs will remain, mixed in with the production wafers. On the other hand, in the case of using a polishing cloth B which is of the same kind as polishing cloth A, but in which the aforementioned number of rounds of dummy polishing required is less than the set number of rounds of polishing performed in dummy polishing mode, wafers of a quality level with such few LPDs that they should be able to be used as production wafers end up being fabricated by dummy polishing, leading to wafer losses.

Stated differently, if the number of rounds of dummy polishing is set high in advance so that wafers with large numbers of LPDs do not remain, mixed in with the production wafers, the probability of wafer loss due to dummy polishing becomes higher, and conversely, if the number of rounds of dummy polishing is set low so as to reduce wafer loss due to dummy polishing, the probability of wafers with large numbers of LPDs remaining, mixed in with the production wafers becomes higher.

Note that PTL 1 describes that dummy polishing is to be performed until the concentration of copper within the polishing cloth becomes 0.01 ppm or less. However, this method requires that test pieces be cut from the polishing cloth in order to measure the concentration of copper, which must be improved in practice.

In view of these problems, an object of this disclosure is to provide a practical method of polishing a wafer and a practical water polishing apparatus that can reduce wafer losses due to dummy polishing and also stabilize the LPD count in production wafers at a low level.

The inventor made further studies to achieve the above object, and thus found the following. Firstly, the present inventor focused upon the contact angle of the polishing cloth as an index indicating the state of the surface of the polishing cloth. The inventor then found that the contact angle of the polishing cloth was closely related to the LPD count in the waters polished with that polishing cloth.

The present disclosure completed based on the above findings, and its gist is as follows.

A method of polishing a wafer according to the present disclosure, in which a water is brought into contact with a polishing cloth provided on a surface of a polishing plate, and the wafer and the polishing plate are rotated thereby performing several rounds of a polishing process on the surface of the wafer using the same polishing cloth, is characterized in that the polishing process comprises:

polishing the wafer in an initial polishing mode to obtain a polished wafer that is not used as a product, and polishing the wafer in a production mode after the initial polishing mode to obtain a polished wafer that is used as a product and wherein a contact angle of the polishing cloth is measured, and based on the measured value thereof, a timing for a switchover from the initial polishing mode to the production polishing mode is determined.

In one embodiment, in order to determine the switchover timing, the contact angle of the polishing cloth may be measured regularly or in each round prior to the polishing process, and the polishing processes after the measured value stabilizes may be set to be performed in production polishing mode.

In another embodiment, in order to determine the switchover timing, when the measured value is equal to or less than a threshold value, the polishing processes thereafter may be set to be performed in production polishing mode.

In this case, a test polishing cloth of the same kind as the polishing cloth is preferably used to repeatedly perform the polishing process and a measurement of the contact angle of the test polishing cloth, and the threshold value is preferably determined based on the value of the contact angle of the test polishing cloth when the measured values are stabilized.

In the present disclosure, it is preferred that the polishing plate is spun so as to remove a polishing solution upon the polishing cloth immediately before the measurement of the contact angle of the polishing cloth.

In the present disclosure, it is preferred that the wafer to be polished in the initial polishing mode is a dummy wafer.

In the present disclosure, it is preferred that the contact angle of the polishing cloth is re-measured after the switchover from the initial polishing mode to the production polishing mode, and the timing of a replacement of the polishing cloth in the production polishing mode is determined based on the measured value thereof.

A wafer polishing apparatus according to the present disclosure is provided with a head which retains a wafer; and a polishing plate having a polishing cloth on its surface, in which the wafer is brought into contact with the polishing cloth, and the wafer and the polishing plate are rotated, thereby performing several rounds of a polishing process for polishing the surface of the wafer using the same polishing cloth, the wafer polishing apparatus comprising:

a measuring unit for measuring a contact angle of the polishing cloth; and a control unit for, based on a measured value obtained from the measuring unit, determining a timing for a switchover from an initial polishing mode in which the wafer is polished to obtain a polished wafer that is not used as a product, to a production polishing mode in which the wafer is polished to obtain a polished wafer that is used as a product.

The single-side wafer polishing method and wafer polishing apparatus according to the disclosure can practically reduce wafer losses due to dummy polishing while also stabilizing the LPD count in production wafers at a low level.

BRIEF DESCRIPTION OF THE DRAWINGS

FIG. 5 is a graph of the LPD count per polished wafer in both Comparative Example and Example according to the present disclosure.

FIG. 6 is a schematic view of a conventional single-side wafer polishing apparatus 200.

DETAILED DESCRIPTION

Figure 1:
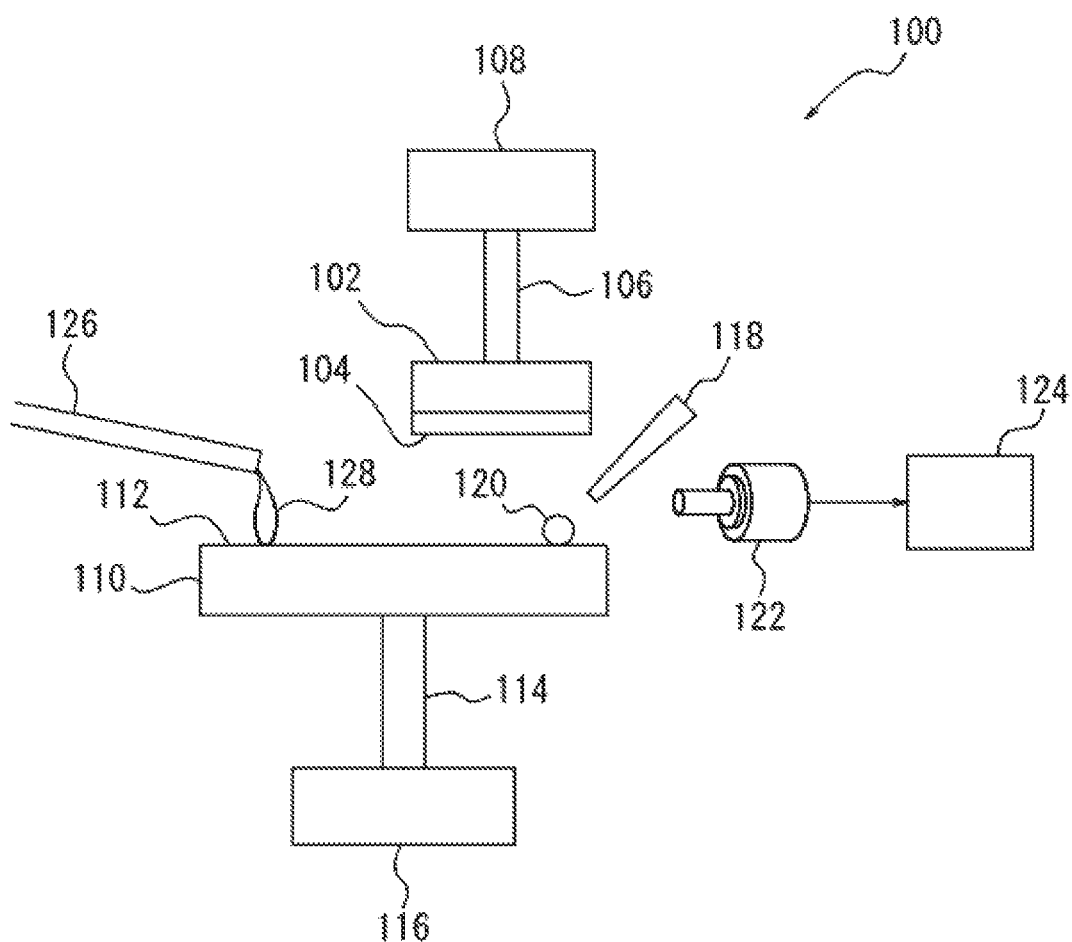
FIG. 1 is a schematic view of a single-side wafer polishing apparatus 100 according to an embodiment of the present disclosure.

Embodiments of the present disclosure will be described in detail below with reference to drawings.

First, a single-side wafer polishing apparatus 100 used in the present disclosure will be described with reference to FIG. 1. The single-side wafer polishing apparatus 100 includes a head 102 for fixing a wafer 104 and a polishing plate 110 having a surface provided with a polishing cloth 112. The head 102 is connected to a motor 108 via a head elevating shaft 106, so that the head 102 and the wafer 104 are rotated by driving the motor 108. The polishing plate 110 is connected to a motor 116 via a polishing plate rotating shaft 114, so that the polishing plate 110 is rotated by driving the motor 116. The polishing target surface on the wafer is polished by bringing the wafer 104, which is fixed to the head 102, into contact with the polishing cloth 112, rotating the head 102 and the polishing plate 110 together, while supplying a polishing solution 128 from a polishing solution supply unit 126 to the polishing cloth 112.

The single-side wafer polishing apparatus 100 has a contact-angle measuring device 122 for measuring the contact angle of the polishing cloth 112. The contact-angle measuring device 122 measures the contact angle of a water drop 120 supplied onto the polishing cloth 112 from a water drop supply unit 118. This measurement indicates the surface condition of the polishing cloth 112. A control unit 124, which may be of arbitrary constitution in the present disclosure, receives input of data containing values measured by the contact-angle measuring device 122. The functions of the control unit 124 will be described below.

The kind of the polishing cloth 112 is not limited. For example, a single-layer polishing cloth may be used or a two-layer polishing cloth in which a sponge layer is formed on the rear surface of a polishing cloth layer may be used. As the polishing cloth layer of the single-layer polishing cloth and the two-layer polishing cloth, for example, a polishing cloth composed of a synthetic resin foam such as urethane foam, a polishing cloth of a hard velour type in which a non-woven cloth made of polyester fabric is impregnated with a urethane resin, or a suede pad in which a urethane resin had been foamed on a nonwoven base fabric may be employed.

The location of the polishing cloth, to be supplied with a water drop for measuring the contact angle is not limited as long as the wafer 104 passes by the location during polishing.

As the polishing solution 128, for example, an alkaline polishing solution containing colloidal silica or the like as abrasive grains may be used. The location to be supplied with the polishing solution is not limited in particular;

however, the polishing solution is preferably supplied to the vicinity of the rotational orbit of the head 102 at the center.

(Method of Polishing One Side of a Wafer)

Next, a method of polishing one side of a wafer according to an embodiment of the present disclosure will be described, with reference to FIGS. 2-4.

First, the present inventor used the single-side wafer polishing apparatus 100 of FIG. 1 to sequentially finish-polish a plurality of wafers one at a time using two new polishing cloths (polishing cloths A and B) made of suede material. The contact angle of the polishing cloth was measured immediately before each of the finish-polishing steps. In addition, the LPD count in each polished wafer was measured with a laser particle counter. This is provided, however, the first 20 rounds of polishing done were considered to be dummy polishing, so the measurement of the contact angle of the polishing cloth and the measurement of the wafer LPD count after polishing were not performed.

Figure 3:
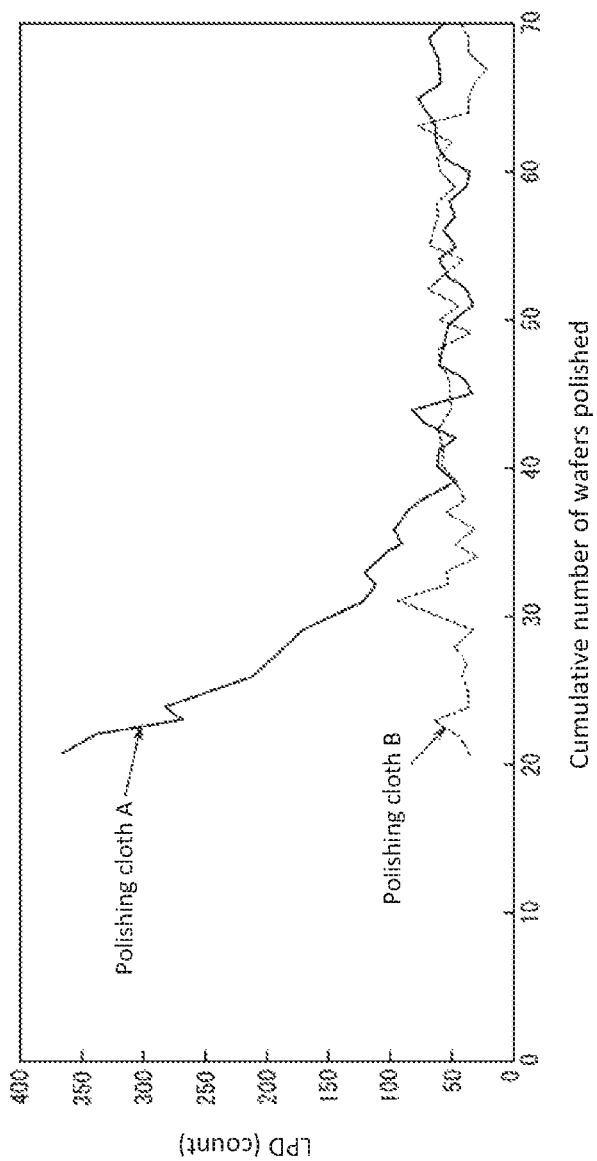
FIG. 3 is a graph of the LPD count per polished wafer at the time of sequentially polishing a plurality of wafers with each of two polishing cloths of the same kind.

FIG. 3 presents the relationship between the LPD count and the cumulative number of wafers polished by polishing cloth A and polishing cloth B, respectively. With polishing cloth A, the LPD count on the 21st wafer was extremely large, in excess of 350 defects, but as polishing with polishing cloth A continued, the LPD count also decreased and at around the 40th wafer or so, the LPD count stabilized at around 50 defects. On the other hand, with polishing cloth B, the LPD count had already dropped below 50 defects on the 21st wafer, and the LPD count remained stabilized at around 50 defects in wafers polished thereafter. In this manner, it was confirmed that even with the same kind of polishing cloth, the number of rounds of polishing that must be performed until the LPD count of the polished wafer stabilizes (the cumulative number of wafers polished) is different for each individual polishing cloth. Because of this, it is appreciated that with a method in which the timing of the change from dummy polishing mode to production polishing mode is uniformly determined based on the cumulative number of wafers polished, as described above, a sacrifice must be made of either LPD dispersion in production wafers or wafer losses due to dummy polishing.

Figure 4:
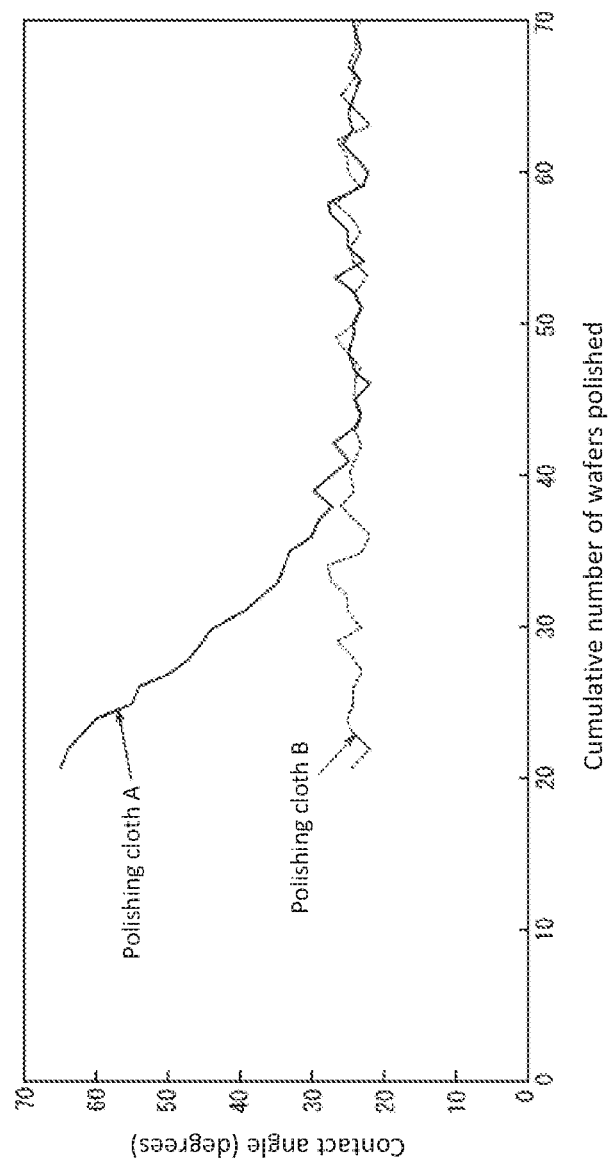
FIG. 4 is a graph of the contact angle of the polishing cloth as a function of the cumulative number of wafers polished, obtained in the experimental example of FIG. 3 by measuring the contact angle of the polishing cloth immediately before each round of polishing.

FIG. 4 presents the relationship between the contact angle of the polishing cloth and the cumulative number of wafers polished by polishing cloth A and polishing cloth B, respectively. With polishing cloth A, the contact angle measured immediately before polishing the 21st wafer was relatively high at roughly 65 degrees, indicating a hydrophobic state, and as polishing with polishing cloth A continued thereafter, the contact angle of the polishing cloth also decreased until the contact angle immediately before polishing the 40th and subsequent wafers stabilized within a range of 20-30 degrees, indicating a hydrophilic state. On the other hand, with polishing cloth B, the contact angle immediately before polishing the 21st wafer was already roughly 25 degrees, and thereafter the contact angle of the polishing cloth was stabilized within a range of 20-30 degrees.

From FIGS. 3 and 4, one can see that there is a good correlation between the contact angle of the polishing cloth and the LPD count of the wafers polished with that polishing cloth, in the sense that wafers polished in the state in which the contact angle of the polishing cloth is high have large numbers of LPDs, but wafers polished with a low contact angle have few LPDs.

In view of this, it is decided that, when performing finish polishing with different polishing cloths of the same kind as polishing cloths A and B, rather than uniformly setting the number of rounds of dummy polishing to 20 rounds, the contact angle of the polishing cloth is measured every round before polishing or regularly, and all subsequent polishing in production polishing mode is performed only once the contact angle can be confirmed to have dropped to within the range of 20-30 degrees and stabilized. By doing so, it is possible to make the LPD count of the wafers obtained in production polishing mode stable at a low level, and also the wafer losses due to dummy polishing can be made as low as possible.

Next, based on these findings, an embodiment of the method of wafer polishing according to the present disclosure will be described with reference to FIG. 2. Different polishing cloths of the same kind as polishing cloths A and B are mounted onto the surface of polishing plate and the polishing method according to this embodiment is started. First, a dummy wafer is secured in the head (step S1), and the wafer thus secured is polished in dummy polishing mode (step S2). Upon completion of dummy polishing, the polished dummy wafer is removed from the head, and the polishing plate is spun to remove the polishing solution from the polishing cloth (step S3). Thereafter, the contact angle of the polishing cloth is measured (step S4).

Based on the measured value of the contact angle, it is determined whether or not three or more consecutive measured values are within ±3 degrees (step S5). If this condition is not satisfied, the operation is returned to step S1 and the wafer is polished in dummy polishing mode. To wit, a determination of No will naturally result after the first and second rounds of dummy polishing.

On the other hand, if in step S5, a determination is made that three or more consecutive measured values are within ±3 degrees, the operation is switched to production polishing mode. To wit, a production wafer is secured in the head (step S6), and the production wafer thus secured is subjected to finish polishing in production polishing mode (step S7). All subsequent polishing can be done in production polishing mode. To wit, if not at the end of a polishing run (step S8), the previous polished production wafer is removed from the head and a new production wafer is secured in the head (step S6), the operation is returned to production polishing mode (step S7), and repeat. At the end of the polishing run (step S8), the operation is terminated.

With this method, in the case of using a polishing cloth having the same properties as polishing cloth A, the polishing after approximately the 40th wafer will become production polishing, but in the case of using a polishing cloth having the same properties as polishing cloth B, the polishing will become production polishing after less than 20 wafers (for example the 15th wafer).

With the method according to this embodiment, when the polishing process is performed multiple times with the same polishing cloth, as illustrated above, the contact angle of the polishing cloth is measured and, based on this measured value, the timing of the switchover from the initial polishing mode (dummy polishing mode) to the production polishing mode is determined. Thus, it is possible to reduce wafer losses due to dummy polishing and also stabilize the LPD count in production wafers at a low level. In addition, the polishing cloth is evaluated in a nondestructive manner so its practicality is high.

Specifically, as described above, the contact angle of the polishing cloth is measured regularly or every time after the polishing process, and once the measured value stabilizes, it is possible to set the next and subsequent polishing processes to be performed in production polishing mode. In the present embodiment, if three or more consecutive measured values are within ±3 degrees (or namely, when three measured values first fall within ±3 degrees) the contact angle is deemed to have stabilized (in the asymptotic state). Although the convergent value of the contact angle differs somewhat depending on the kind of polishing cloth, this definition is applicable independent of the kind of polishing cloth.

Figure 2:
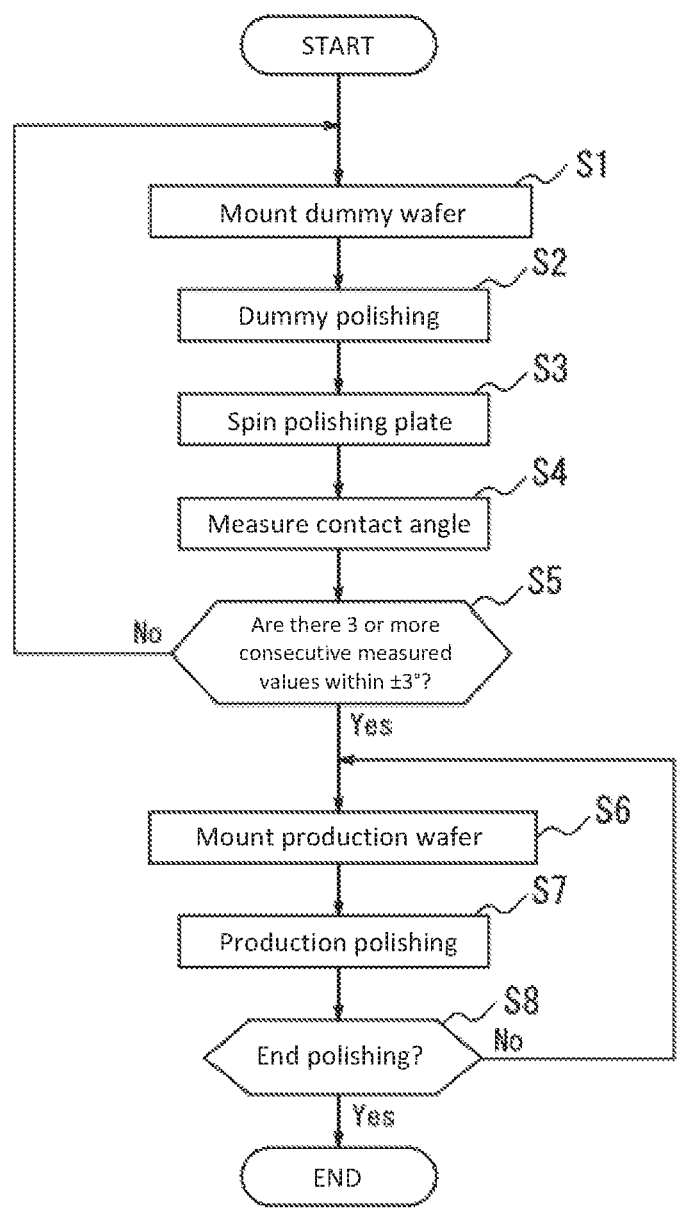
FIG. 2 is a flowchart of a wafer polishing method according to an embodiment of the present disclosure.

As another way of determining the switchover timing, it is possible to experimentally find the contact angle at such time that wafers with few LPDs are obtained and make the determination in step S2 of FIG. 2 "whether or not the measured value of the contact angle is equal to a stipulated value or less." For example, if the measured value exceeds 30 degrees in step S5, the operation is returned to dummy polishing mode (step S2), but if the measured value is 30 degrees or less, the operation is advanced to production polishing mode (step S6), in this manner, it is possible to determine that the polishing process for the next and subsequent wafers is to be done in production polishing mode if the measured value of the contact angle of the polishing cloth is equal to or less than a threshold value. Moreover, this threshold value is determined, upon repeatedly performing the polishing process and measuring the contact angle of test polishing cloth which is the same kind as the polishing cloth used in finish polishing (in the aforementioned case, polishing cloths A and B), based on the value at the time that the measured value of the contact angle of the test polishing cloths is stabilized. In the present embodiment, the contact angles of polishing cloths A and B stabilized within the range of 20 to 30 degrees, so 30 degrees was set as the threshold value. The determination of whether or not the measured value has stabilized is performed, as described above, based on whether or not three or more consecutive measured values are within ±3 degrees. The method of determining the threshold value is not particularly limited; for example, it may be the average value of the above three values or the maximum value of the three values. Note that in the present embodiment, the contact angle is measured based on the θ/2 method upon dropping a 1,000 μg drop of water.

The measurement of the contact angle of the polishing cloth is not limited to being performed each round after polishing in dummy polishing mode as shown in FIG. 2. For example, the contact angle may also be measured once every two rounds of polishing in dummy polishing mode. In addition, if the minimum required number of rounds of dummy polishing is already known from experience, the measurement of the contact angle may be started after that number of rounds of dummy polishing is performed.

Here, the waters polished in dummy polishing mode will not become products, so it is preferable that the wafer to be polished in the dummy polishing mode is a dummy wafer which is lower in cost than a production wafer.

As shown in FIG. 2, after the switchover to production polishing mode, it is not always necessary to measure the contact angle. However, it is also possible to measure the contact angle of the polishing cloth even in production polishing mode and determine the timing to replace the polishing cloth in production polishing mode based on the measured value thereof. To wit, the contact angle of the polishing cloth is a strong index for making a determination of the lifetime of the polishing cloth. Polishing cloths are consumables and up until now, a polishing cloth had been used for a stipulated number of rounds of polishing and then discarded and replaced with a new polishing cloth. However, the number of rounds of polishing for which a polishing cloth can actually be used until it is unusable may depend on the individual polishing cloth or the polishing conditions, and not only had there been dispersion but it had been difficult to determine whether or not a polishing cloth is usable. For this reason, the aforementioned stipulated number of rounds had been set with a safety margin within a range that the polishing cloth is still usable. However, it was found that the contact angle of the polishing cloth increases gradually in production polishing mode toward the end of use. Thus, it is possible to set the stage at which the contact angle assumes a stipulated threshold value as the limit of use for the polishing cloth.

In this case, the contact angle can be measured after polishing in production polishing mode, and if the measured value is equal to or less than a stipulated threshold value, that polishing cloth may be deemed to be still usable and supplied as is for the next round of polishing in production polishing mode, but if the measured value exceeds the stipulated threshold value, that polishing cloth may be deemed unusable, prompting its replacement. In this manner, one may ascertain the surface state of the polishing cloth from the contact angle of the polishing cloth, and thereby accurately determine the timing to replace the polishing cloth, thereby permitting the polishing cloth to be used up to the very end of the true service lifetime of the polishing cloth. This can reduce wafer fabrication costs.

The threshold value of the contact angle of the polishing cloth depends on the kind of polishing cloth, its hardness, coefficient of restitution and other factors, but may be set to 70 degrees, for example. In addition, the determination of lifetime based on the contact angle of the polishing cloth explained here may also be performed independently of the aforementioned determination of the timing of the switchover from dummy polishing mode to production polishing mode based on the contact angle of the polishing cloth.

In the present embodiment, the single-side finish polishing method in which one wafer is polished each round has been discussed, but the present disclosure is not limited thereto, as it can also be applied to a method of polishing a plurality of wafers in one round or to a two-sided polishing method.

In the present disclosure, the determination of the switchover timing from dummy polishing mode to production polishing mode based on the measured value of the contact angle, and the determination of the timing for replacing the polishing cloth may also be performed automatically by means of the control unit 124 shown in FIG. 1. For example, the single-side wafer polishing apparatus 100 has a memory (not shown), and this memory stores data representing the threshold value A (in the present embodiment, 30 degrees) used at the time of performing the switchover from dummy polishing mode to production polishing mode, and data representing the threshold value B (in the present embodiment, 70 degrees) used at the time of performing the replacement of the polishing cloth.

Upon receiving input of the measured value of the contact angle of the polishing cloth 112 output from the contact-angle measuring device 122 in the stage of dummy polishing, the control unit 124 reads out the data representing threshold value A from the memory, compares threshold value A and the measured value and makes a determination as to whether the next and subsequent rounds of polishing are to be performed in dummy polishing mode or in production polishing mode. The control unit 124 stores the results of determination (more specifically, a combination of the cumulative number of rounds of polishing n and the results of determination) in memory.

Alternatively, upon receiving input of the measured value of the contact angle of the polishing cloth 112 output from the contact-angle measuring device 122 in the stage of dummy polishing, the control unit 124 determines whether or not three or more consecutive measured values are within ±3 degrees, and makes a determination as to whether the next and subsequent rounds of polishing are to be performed in dummy polishing mode or in production polishing mode. The control unit 124 stores the results of determination (more specifically, a combination of the cumulative number of rounds of polishing n and the results of determination) in memory.

The user of the single-side wafer polishing apparatus 100 according to the present embodiment may, by reading out the results of determination from memory later, can ascertain the wafer position at which to start placing production wafers. In addition, the control unit 124 may also separately use a notification means such as a speaker, display or the like to notify users of the results of determination.

Upon receiving input of the measured value of the contact angle of the polishing cloth 112 output from the contact-angle measuring device 122 during the production polishing stage, the control unit 124 reads out the data representing threshold value B front the memory, compares threshold value B and the measured value and makes a determination as to whether the polishing cloth is to be replaced. The control unit 124 may store the results of determination in memory. In addition, if the measured value exceeds threshold value B, control unit 124 does not permit motors 108 and 116 to drive. The control unit 124 may also separately use a notification means such as a speaker, display and the like to prompt the operator to replace the polishing cloth.

EXAMPLES

Example

Silicon wafers having a diameter of 300 mm were subjected to an experiment. Suede polishing cloth of the same kind as the polishing cloth used in the experiment illustrated in FIGS. 3 and 4 was mounted on the polishing plate of the single-side wafer polishing apparatus shown in FIG. 1. This single-side wafer polishing apparatus was used to perform finish polishing of the silicon wafers one at a time. The polishing conditions were as follows.

Polishing pressure: 125 g/cm$^2$
Polishing time: 360 s
Polishing solution: alkaline polishing solution (containing colloidal silica)

After the polishing of each silicon wafer, purified water was dripped onto the polishing cloth, and the contact angle of the polishing cloth was measured using an automated contact angle meter (DMs-400Hi/400 manufactured by Kyowa Interface Science Co., Ltd.). Polishing was performed in accordance with the flow illustrated in FIG. 2. To wit, after three or more consecutive measured values are within ±3 degrees, polish in production polishing mode. As a result, 42 rounds of polishing were done in dummy polishing mode, and then production polishing mode was started. In this experiment, 100 rounds of polishing were done in production polishing mode.

The contact angle of the polishing cloth at the end of production polishing mode was 28 degrees. Thereafter, upon investigating the change in the contact angle by further continuing to alternate polishing of silicon wafers and measurement of the contact angle, a trend was observed wherein the contact angle began to increase greatly after the 252nd round of polishing in production polishing mode. This polishing cloth had been conventionally replaced after roughly 200 rounds of polishing in order to reliably avert the mixing in of wafers with large numbers of LPDs, whereas, in this experiment, it was possible to use the polishing cloth up to the very end of the true service lifetime of the polishing cloth.

The surfaces of the wafers polished in production polishing mode were measured with a laser particle counter (manufactured by KLA-Tencor Corporation, model SP-3) to find the LPD count. The results are shown in FIG. 5.

Comparative Example

Silicon wafers having a diameter of 300 mm were subjected to an experiment. Suede polishing cloth of the same kind as the polishing cloth used in the experiment illustrated in FIGS. 3 and 4 was mounted on the polishing plate of the single-side wafer polishing apparatus shown in FIG. 6. This single-side wafer polishing apparatus was used to perform finish polishing of the silicon wafers one at a time. The polishing conditions were the same as in Example.

The polishing process was performed in 100 rounds, with the first 20 rounds in dummy polishing mode and the 21st and subsequent rounds in production polishing mode. The LPD count of the wafers polished in production polishing mode was found in the same manner as in Example. The results are shown in FIG. 5.

Results

As is evident from FIG. 5, in Comparative Example, wafers with large numbers of LPDs remained and were mixed in with the wafers subjected to polishing in production polishing mode, so the dispersion in LPD count was large. It is appreciated that the polishing cloth used in Comparative Example was polishing cloth having the same properties as polishing cloth A in FIGS. 3 and 4. On the other hand, in Example, since the number of rounds of dummy polishing was 42 rounds, it is appreciated that again a polishing cloth having the same properties as polishing cloth A was used, but the count of the wafers subjected to polishing in production polishing mode was stabilized at a low level. Note that where the average LPD count was 97.4 defects and the standard deviation was 79.4 in Comparative Example, the average LPD count in Example was 45.8 defects and the standard deviation was 13.9.

The single-side wafer polishing method and wafer polishing apparatus according to the present disclosure provide a practical wafer polishing method that is able to reduce wafer losses due to dummy polishing and also stabilize the LPD count in production wafers at a low level.

REFERENCE SIGNS LIST

100 Wafer single-side polishing apparatus
102 Head
104 Wafer
106 Head elevating shaft
108 Motor
110 Polishing plate
112 Polishing cloth
114 Polishing plate rotating shaft
116 Motor
118 Water drop supply unit
120 Water drop
122 Contact-angle measuring device
124 Control unit
126 Polishing solution supply unit
128 Polishing solution

The invention claimed is:

1. A method of polishing a wafer, the method comprising:
polishing at least one initial wafer in an initial polishing mode to obtain at least one polished initial wafer that is not used as a product;
measuring a contact angle of a drop of water supplied onto a polishing cloth after the polishing of the at least one initial wafer;
determining, based on the measured contact angle, a timing for a switchover from the initial polishing mode to a production polishing mode; and
polishing the at least one production wafer in the production polishing mode after the initial polishing mode to obtain at least one polished production wafer that is used as a product.

2. The method of polishing a wafer according to claim 1, wherein the contact angle of a drop of water supplied onto the polishing cloth is measured regularly or in each round prior to the polishing process, and the polishing processes after the measured value stabilizes are set to be performed in the production polishing mode.

3. The method of polishing a wafer according to claim 1, wherein when the measured value is equal to or less than a threshold value, the polishing processes thereafter are set to be performed in the production polishing mode.

4. The method of polishing a wafer according to claim 3, wherein a test polishing cloth of the same kind as the polishing cloth is used to repeatedly perform the polishing process and a measurement of the contact angle of a drop of water supplied onto the test polishing cloth, and the threshold value is determined based on the value of the contact angle of a drop of water supplied onto the test polishing cloth when the measured values are stabilized.

5. The method of polishing a wafer according to claim 1, wherein the polishing plate is spun so as to remove a polishing solution upon the polishing cloth immediately before the measurement of the contact angle of a drop of water supplied onto the polishing cloth.

6. The method of polishing a wafer according to claim 1, wherein the wafer to be polished in the initial polishing mode is a dummy wafer.

7. The method of polishing a wafer according to claim 1, wherein the contact angle of a drop of water supplied onto the polishing cloth is re-measured after the switchover from the initial polishing mode to the production polishing mode, and the timing of a replacement of the polishing cloth in the production polishing mode is determined based on the measured value thereof.

8. A wafer polishing apparatus comprising:
a measuring device that measures a contact angle of a drop of water supplied onto a polishing cloth; and
a controller that, based on a measured contact angle value obtained from the measuring device, determines a timing for a switchover from an initial polishing mode in which at least one initial wafer is polished to obtain at least one polished initial wafer that is not used as a product, to a production polishing mode in which at least one production wafer is polished to obtain at least one polished production wafer that is used as a product.

* * * * *